United States Patent
Singh et al.

(10) Patent No.: US 7,058,915 B1
(45) Date of Patent: Jun. 6, 2006

(54) PIN REORDERING DURING PLACEMENT OF CIRCUIT DESIGNS

(75) Inventors: Amit Singh, San Jose, CA (US); Kamal Chaudhary, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 291 days.

(21) Appl. No.: 10/676,445

(22) Filed: Sep. 30, 2003

(51) Int. Cl.
 *G06F 17/50* (2006.01)
(52) U.S. Cl. ............................. 716/10; 716/6
(58) Field of Classification Search ............... 716/10, 716/6
See application file for complete search history.

(56) References Cited

U.S. PATENT DOCUMENTS

| 5,461,576 A | * | 10/1995 | Tsay et al. ............... 716/6 |
| 5,729,468 A | * | 3/1998 | Cox ........................ 716/6 |
| 5,850,355 A | * | 12/1998 | Molnar ................... 703/15 |
| 5,956,257 A | * | 9/1999 | Ginetti et al. ............ 716/3 |
| 6,591,407 B1 | * | 7/2003 | Kaufman et al. ........ 716/10 |

OTHER PUBLICATIONS

"Bus Deskewing Method using a Self-Adjusting Variable Delay Element", IBM Technical Disclosure Bulletin, Oct. 1994, vol. 37, iss. 10, pp. 499-500.*
Tsing-Fa Lee et al.; "An effective Methodology for Function Pipelining"; 1992 International Conference on Computer Aided Design; Nov. 8-12, 1992; Copyright IEEE 1992; pp. 230233.

* cited by examiner

*Primary Examiner*—Sun James Lin
(74) *Attorney, Agent, or Firm*—Kevin Cuenot

(57) ABSTRACT

A method (400) of placing a circuit design can include the steps of identifying topological levels of a circuit design representation (415) and determining an arrival time for each input signal to a look up table within a circuit design representation (420). The propagation delay associated with each pin of the look up table can be identified (420) such that the input signals of the look up table can be ordered according to the arrival times of each input signal and the propagation delay of each pin of the look up table (435). The method can continue processing each look up table of an identified topological level (440) as well as each topological level of the circuit design representation (455).

28 Claims, 2 Drawing Sheets

PIN REORDERING DURING PLACEMENT OF CIRCUIT DESIGNS

BACKGROUND

1. Field of the Invention

The invention relates to the field circuit design and, more particularly, to placing components and routing signals of circuit designs.

2. Description of the Related Art

Circuit designs, and particularly designs for Field Programmable Gate Arrays (FPGA's), have become increasingly complex and heterogeneous. Modern circuit designs can include a variety of different components or resources including, but not limited to, registers, block Random Access Memory (RAM), multipliers, processors, and the like. This increasing complexity makes placement of components as well as the routing of signals within a circuit design more cumbersome.

One component, called a look up table (LUT), is frequently utilized as a basic building block in modern FPGAs. Generally, an LUT is used to implement any of a variety of different functions of 4 inputs. The LUT can be viewed as a sort of single complete multiplexer tree with 4 selector inputs which connected to the LUT through 4 input pins. Traditionally, the input selector pins processed by LUTs had symmetrical delays as modeled in software algorithms. That is, the delays from the input pins of the LUT to the output of the LUT were substantially the same. Thus, there was no substantial difference in choosing either of the 4 input pins for the signals connected to these pins. With regard to modern circuit designs implemented in FPGAs, however, the input selector pins provided to LUTs have become asymmetric in nature in terms of propagation delay. That is, some of the input pins have substantially different propagation delays to the output of the LUT than the remaining input pins.

FIGS. 1A and 1B are schematic diagrams illustrating the asymmetric nature of delays of input pins of a LUT. As shown in FIG. 1A, the LUT 100 includes four physical inputs or pins F1, F2, F3, and F4. Each pin F1, F2, F3, and F4 can receive a signal serving as an input to a function f(F1, F2, F3, F4) implemented by the LUT.

FIG. 1B represents the internal workings of the LUT 100 as a simplistic, complete tree. Pins of the LUT 100 are indicated by arrows. The tree itself includes 4 levels corresponding to the pins F1, F2, F3, and F4. The pins F1, F2, F3, and F4 act as multiplexer select lines. The value received on each respective pin, a 0 or a 1, determines whether a 0 or 1 stored in the memory cells 105 is propagated to a subsequent level of the tree.

The amount of time required for each level of the LUT 100 to produce an output is dependent upon the evaluation time of the previous level in the tree. Thus, level F1 is evaluated before level F2; level F2 is evaluated before level F3, and so on. Level F1, therefore, requires the most time, or is said to have the largest propagation time, for a signal to reach the output of the LUT 100. Conversely, level F4 has the smallest propagation time. This difference in propagation time among the levels of the LUT 100 can be modeled as asymmetric delays in the input pins of the LUT 100.

Conventional circuit placers perform little or no analysis with respect to the arrival time of signals at LUT inputs or the propagation time of various levels of LUTs in a circuit design. As such, a circuit placer may pair an input signal that arrives at the LUT later than the other signals with a pin of the LUT such as F1 that corresponds to a processing path having a high propagation time. In consequence, the processing time required by the LUT is increased. More particularly, the LUT cannot begin processing at level 1 until a signal is received on pin F1. As the signal to pin F1 arrives later than the other input signals to the LUT 100, processing of the LUT 100 is delayed by approximately the difference between the arrival time of the late arriving input signal and earlier arriving signals. Moreover, the pairing of a late arriving signal with a pin having a higher propagation delay further increases the overall time required for the LUT 100 to implement the function f(F1, F2, F3, F4).

What is needed is a technique for analyzing the asymmetry of LUT input pins as well as the time in which signals arrive at those inputs to determine a better pairing of signals with LUT pins.

SUMMARY OF THE INVENTION

The present invention generally includes techniques for ordering input signals of a component which has functionally equivalent input pins with unequal arrival times of at least some of the input signals and at least some unequal propagation delays through the circuit block in order to achieve improved circuit performance in terms of circuit clock frequency. While particular disclosed embodiments below describe a Look Up Table (LUT) as an example of the component, other examples such as a random access memory (RAM) or any other circuit having input signals with asymmetric delays are also considered components within the scope of the present invention.

In accordance with the inventive arrangements disclosed herein, the asymmetry of arrival times of input signals and the propagation delay associated with processing paths through a component is evaluated. The input signals of the component can be ordered according to the arrival time of each signal as well as the propagation delay of processing paths through the component. In consequence, the component can execute a function in less time, which allows the component itself to operate, as well as be used within circuit designs having, increased clock speeds. An example of a component is a LUT.

One embodiment of the present invention can include a method of placing a circuit design having a look up table. The method can include determining an arrival time for each of at least two input signals to the look up table and identifying the propagation delays associated with each input port or pin of at least two pins of the look up table. The input signals of the lookup table can be ordered according to the arrival times of the input signals and the propagation delays of the pins of the look up table.

In another embodiment of the present invention, topological levels of the circuit design representation can be identified. Accordingly, the steps of determining an arrival time, identifying the propagation delay, and ordering input signals of the look up table can be repeated for each look up table within the identified topological level. The method further can be repeated to process each identified topological level of the circuit design representation. Notably, the topological levels can be processed in hierarchical order. Timing information for the circuit design representation can be updated after input signals of each look up table of an identified topological level have been ordered.

The ordering step can include the step of matching input signals having an earlier arrival time with pins of the lookup table having longer propagation delays. Accordingly, the matching step can match an input signal having an earliest arrival time with a pin of the lookup table having a longest propagation delay as well as an input signal having a latest arrival time with a pin of the lookup table having a shortest propagation delay.

According to another embodiment of the present invention, the ordering step can include sorting input signals according to an arrival time at the look up table, sorting pins of the look up table according to propagation delay, and matching input signals having an earlier arrival time with pins of the look up table having longer propagation delays. As noted, the matching step can match an input signal having an earliest arrival time with a pin of the lookup table having a longest propagation delay, and an input signal having a latest arrival time with a pin of the lookup table having a shortest propagation delay.

Other embodiments of the present invention, when configured in accordance with the inventive arrangements disclosed herein, can include a system for performing, and a machine readable storage for causing a machine to perform, the various processes disclosed herein.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

Various embodiments of the present invention include a method, system, and apparatus for analyzing asymmetry with respect to the arrival times of signals at the inputs of a Look Up Table (LUT) and the propagation delay associated with signal paths through the LUT. In accordance with the inventive arrangements disclosed herein, the signals provided to LUTs can be ordered according to the arrival times of the signals at the LUT as well as the propagation delay of signal paths through the LUT. The ordering allows the slowest pins of the LUT to be associated with, or receive, signals arriving the earliest, while the fastest pins of the LUT can be assigned signals that arrive later. This is the same as ordering signals to the LUT inputs in an As Soon As Possible (ASAP) fashion.

Figure 1A:
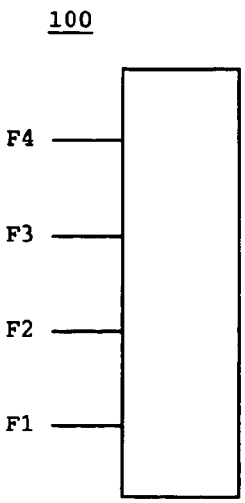
FIGS. 1A and 1B are schematic diagrams illustrating the asymmetric nature of input signal pins provided to a Look Up Table (LUT).
Figure 1B:
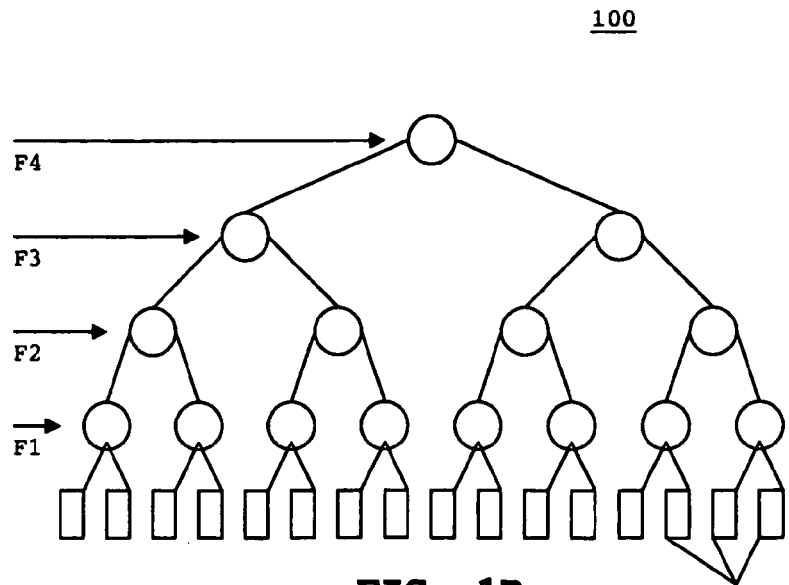
Figure 2:
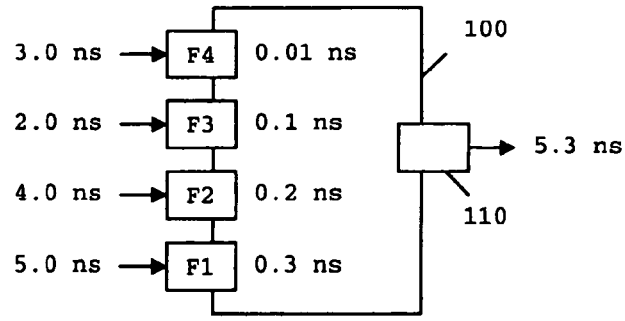
FIG. 2 is a schematic diagram illustrating input signal arrival times and propagation delays associated with an exemplary LUT in accordance with the inventive arrangements disclosed herein.

FIG. 2 is a schematic diagram illustrating input signal arrival times and propagation delays associated with an exemplary LUT 100 in accordance with the inventive arrangements disclosed herein. As shown, LUT 100 has four input ports or pins F1, F2, F3, and F4. The propagation delay of the signal or processing path through the LUT 100 is shown for each input port or pin. For example, pin F4 has a propagation delay of 0.01 ns, pin F3 a propagation delay of 0.1 ns, pin F2 a propagation delay of 0.2 ns, and pin F1 a propagation delay of 0.3 ns.

The signals arriving at the LUT 100 are represented as arrows to each pin. The times indicate the time after a reference time of 0 ns that each respective signal arrives at its corresponding pin. Thus, the input signal to pin F4 arrives at 3.0 ns. The input signal to pin F3 arrives 1.0 ns earlier at a time of 2.0 ns. The input signal to pin F2 arrives at a time of 4.0 ns, while the input signal to pin F1 arrives at a time of 5.0 ns.

The LUT 100 implements a programmed function represented as f(F1, F2, F3, F4). The output signal illustrated by the arrow leaving the output pin 110 is generated or provided at a time of 5.3 ns. To determine the time at which an output is available from the LUT 100, each input signal arrival time is summed with the propagation delay of the pin to which the input signal is assigned or associated. The largest of the determined sums is the time an output is available from pin 110. Thus, in this case, the output time is determined by pin F1. In particular, the output time is equal to the sum of the input signal arrival time of 5.0 ns and the propagation delay of 0.3 ns.

Figure 3:
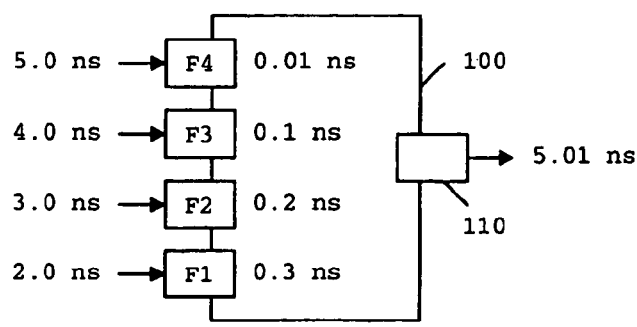
FIG. 3 is a schematic diagram illustrating input signal arrival times and propagation delays associated with an exemplary LUT after the input signals have been ordered in accordance with one embodiment of the present invention.

FIG. 3 is a schematic diagram illustrating input signal arrival times and propagation delays associated with the exemplary LUT 100 after the input signals have been ordered in accordance with one embodiment of the present invention. As shown, the input signals have been ordered such that the input signal having the earliest arrival time, in this case 2.0 ns is matched with pin F1, the pin having the longest propagation delay. The input signal having the latest arrival time of 5.0 ns has been matched with pin F4 having the shortest propagation delay. The remaining input signals have been matched with pins such that signals having increasing arrival times are matched with pins having decreasing propagation delays.

Notably, by ordering the input signals of the LUT 100, the time at which an output is available can be improved by 0.29 ns. As shown, the time at which an output is available from output pin 110 is now 5.01 ns. After the input signals are ordered, the time at which an output signal is available from the output pin 110 is determined by the sum of the input signal arrival time of 5.0 ns and the propagation delay of 0.01 ns for the pin F1.

While FIG. 3 shows four input signals being matched to four input ports or pins (F1–F4) in LUT 100, this one-to-one-to-one mapping is for illustration purposes only. In other embodiments of the present invention the LUT may have two, three, four, or more input ports or pins and there may be two three, or more input signals. For example, there may be only two input signals, e.g., input signals with arrival times, 3.0 ns and 2.0 ns. These input signals would be matched to pins F4 and F3, respectively. As can be seen by one of ordinary skill in the art, other permutations and combinations of input signals and input ports (pins) may be implemented.

Figure 4:
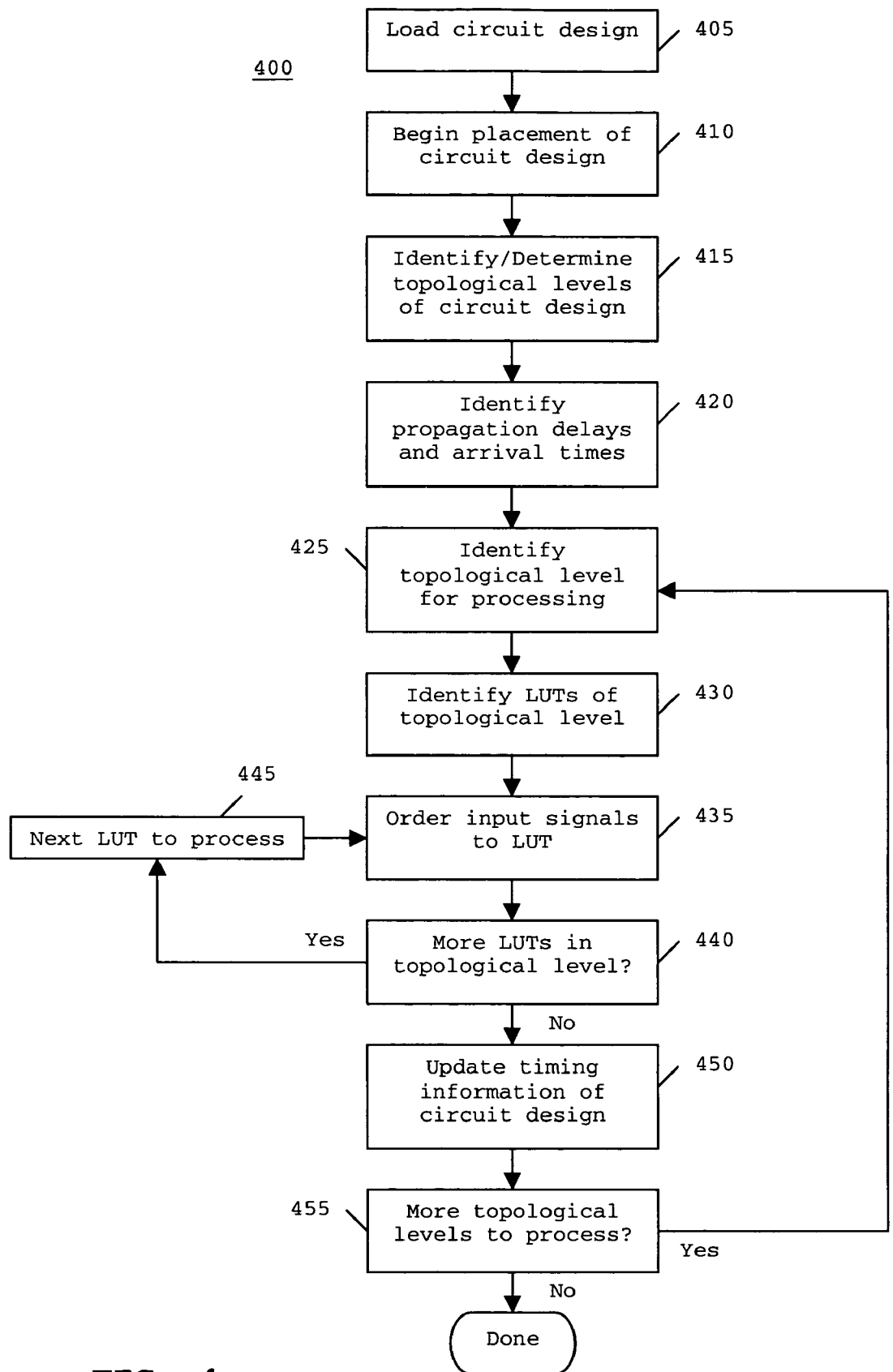
FIG. 4 is a flow chart illustrating a method for ordering input signals of an LUT in accordance with one embodiment of the present invention.

FIG. 4 is a flow chart illustrating a method 400 for ordering input signals of an LUT in accordance with one embodiment of the present invention. The method 400 can be implemented by a software-based circuit design tool which can receive and place and/or route a circuit design representation. As is known, placing refers to assigning components of a circuit design to physical locations on a chip and routing refers to routing signals between components of the circuit design. Circuit designs or circuit design representations can include any physical description of a circuit design in terms of the components to be used, including but not limited to, netlists, circuit descriptions conforming to open standards such as the Berkeley Logic Interchange Format (BLIF), as well as circuit descriptions conforming to proprietary standards such as Native Circuit Description as used by Xilinx, Inc. of San Jose, Calif.

While the method 400 can be implemented at any point during the placement phase, according to one embodiment of the present invention, the methodology can be implemented after most, if not all, of the placement tasks have been performed. Thus, in step 405, a circuit design can be loaded into a circuit design tool for processing. In step 410, a placement phase can be started. That is, the process of assigning components of the circuit design to particular locations on a chip can begin. In step 415, the topological levels of the circuit design can be determined. The circuit design typically is organized into a hierarchy of levels beginning with the primary inputs to the circuit and ending with one or more outputs of the circuit design. Between the primary inputs and the outputs, input signals flow to various stages of logic. The topological levels of the circuit design can be determined or organized according to the time at which input signals reach various logic components or logic blocks. This can be a function of physical proximity as well as signal routing. Accordingly, the first topological level can be identified as level "i", while additional topological levels are identified as level "i+1" through level "i+n".

In step 420, the arrival times of signals to each look up table can be identified. The propagation delay of each input pin to the look up tables of the circuit design also can be identified. While such timing information may be specified by the circuit design representation and, therefore be readily available, it should be appreciated that the timing information also can be calculated and updated as needed or from time to time as placement or routing of the circuit design representation changes.

In step 425, a topological level of the circuit design can be identified for processing. In this case, the first topological level "i" can be identified or selected. While any of the topological levels can serve as the starting topological level for purposes of method 400, according to one embodiment of the present invention, the topological level that is in the signal path directly after the primary inputs can serve as the starting point. This ensures that the input signal arrival times for each LUT are not greater than the arrival times of signals to LUTs of subsequent levels.

In step 430, the LUTs of the selected topological level can be identified. In step 435, the input signals to an LUT can be ordered. More particularly, an LUT of the selected level is chosen for processing. The input signals to that LUT can be ordered as described herein. The input signal to the LUT that arrives the earliest can be matched with the LUT pin having the longest propagation delay. The input signal to the LUT that arrives the latest can be matched with the LUT pin having the shortest propagation delay. Input signals that arrive between the earliest and latest arriving input signals can be matched with pins of the LUT such that signals arriving increasingly late are matched with LUT pins of decreasing propagation delay. Still, it should be appreciated that according to another embodiment of the present invention, rather than ordering the signals to the LUT, the pins of the LUT can be ordered to accomplish the same result.

In step 440, a determination can be made as to whether additional LUTs remain in the selected topological level that have yet to be processed. If so, the method can proceed to step 445, where a next LUT is selected. The method then can continue to step 435 to continue ordering input signals to LUTs until no further LUTs remain to be processed in the current topological level.

Once the input signals to each LUT in the selected topological level have been ordered, the method can proceed from step 440 to step 450. In step 450, the timing information for the circuit design can be updated. Specifically, the time required for each LUT of the topological level to perform its function can be determined based upon the newly matched input signals and LUT pins. Accordingly, the arrival times of signals at other components, including LUTS, and path slack times can be recalculated. In step 455, a determination can be made as to whether any more topological levels must be processed. If so, the method can proceed to step 425 to identify or select a next topological level for processing. While any of the topological levels that have yet to be processed can be selected as the next topological level for processing, according to one embodiment of the present invention, the next topological level, or level "i+1" can be selected. The method can repeat until each topological level has been processed.

The inventive arrangements disclosed herein provide a technique for improving the latency of a circuit design as well as for increasing the operating frequency of the circuit design. By ordering input signals to, and/or input pins of, an LUT according to signal arrival time and the propagation delay of each input pin, asymmetrical delays can be scheduled more effectively.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of placing a circuit design comprising a component having input signals with asymmetric delays, the method comprising steps of:
   first identifying topological levels of the circuit design;
   determining an arrival time for each input signal of a plurality of input signals to the component;
   identifying a propagation delay associated with each input port of a plurality of input ports of the component; and
   ordering the plurality of input signals of the component according to arrival times associated with the plurality of input signals and propagation delays associated with the plurality of input ports of the component.

2. The method of claim 1, further comprising repeating said determining, said identifying, and said ordering steps for each component within one of said identified topological levels.

3. The method of claim 2, further comprising iteratively performing said repeating step for each of said identified topological levels of the circuit design.

4. The method of claim 3, wherein the identified topological levels are processed in hierarchical order.

5. The method of claim 4, further comprising updating timing information for the circuit design after ordering input signals of each component of an identified topological level.

6. The method of claim 1, said ordering step further comprising a step of matching input signals having an earlier arrival time with input ports of the component having longer propagation delays.

7. The method of claim 6, wherein said matching step matches a first input signal having the earliest arrival time with a first input port of the component having the longest propagation delay, and a second input signal having the latest arrival time with an input port of the component having the shortest propagation delay.

8. The method of claim 1, said ordering step comprising:
   sorting input signals according to an arrival time at the component;
   sorting input ports of the component according to propagation delay; and
   matching said sorted input signals having an earlier arrival time with said sorted input ports having longer propagation delays.

9. The method of claim 8, wherein said matching step matches an input signal having the earliest arrival time with an input port of the component having the longest propagation delay, and an input signal having the latest arrival time with an input port of the component having the shortest propagation delay.

10. The method of claim 1 wherein the component is a look-up table (LUT).

11. A system for placing a circuit design comprising:
    means for first identifying topological levels of the circuit design;
    means for determining an arrival time for each input signal to a component within a circuit design representation;
    means for identifying propagation delay associated with each pin of the component; and
    means for ordering input signals of the component according to the arrival time of each input signal and the propagation delay of each pin of the component; and
    means for causing said means for determining said means for identifying, and said means for ordering to operate on each component within an identified topological level.

12. The system of claim 11, wherein the component is a look up table.

13. The system of claim 11, further comprising means for iteratively processing each of identified topological levels of the circuit design representation, wherein said means for iteratively processing processes the topological levels in hierarchical order.

14. The system of claim 13, further comprising means for updating timing information for the circuit design representation after ordering input signals of each component of an identified topological level.

15. The system of claim 11, said means for ordering further comprising means for matching input signals having an earlier arrival time with pins of the component having longer propagation delays.

16. The system of claim 15, wherein said means for matching matches an input signal having the earliest arrival time with a pin of the component having the longest propagation delay, and an input signal having the latest arrival time with a pin of the component having the shortest propagation delay.

17. The system of claim 11, said means for ordering further comprising:
    means for sorting input signals according to an arrival time at the component;
    means for sorting pins of the component according to propagation delay; and
    means for matching input signals having an earlier arrival time with pins of the component having longer propagation delays.

18. The system of claim 17, wherein said means for matching matches an input signal having the earliest arrival time with a pin of the component having the longest propagation delay, and an input signal having the latest arrival time with a pin of the component having the shortest propagation delay.

19. A machine readable storage, having stored thereon a computer program having a plurality of code sections executable by a machine for causing the machine to perform steps of:

determining an arrival time for each input signal to a look up table within a circuit design representation;

identifying propagation delay associated with each pin of the look up table; and ordering input signals of the look up table according to the arrival time of each input signal and the propagation delay of each pin of the look up table.

20. The computer program of claim 19, further causing the machine to perform a step of first identifying topological levels of the circuit design representation.

21. The computer program of claim 20, further causing the machine to perform a step of repeating said determining, said identifying, and said ordering steps for each look up table within an identified topological level.

22. The computer program of claim 21, further causing the machine to perform a step of iteratively performing said repeating step for each identified topological level of the circuit design representation.

23. The computer program of claim 22, wherein the identified topological levels are processed in hierarchical order.

24. The computer program of claim 23, further causing the machine to perform a step of updating timing information for the circuit design representation after ordering input signals of each look up table of an identified topological level.

25. The computer program of claim 19, wherein said ordering step further comprising a step of matching input signals having an earlier arrival time with pins of the lookup table having longer propagation delays.

26. The computer program of claim 25, wherein said matching step matches an input signal having an earliest arrival time with a pin of the look up table having a longest propagation delay, and an input signal having a latest arrival time with a pin of the look up table having a shortest propagation delay.

27. The computer program of claim 19, wherein said ordering step comprising:

sorting input signals according to an arrival time at the look up table;

sorting pins of the look up table according to propagation delay; and matching input signals having an earlier arrival time with pins of the look up table having longer propagation delays.

28. The computer program of claim 27, wherein said matching step matches an input signal having earliest arrival time with a pin of the lookup table having the longest propagation delay, and the input signal having the latest arrival time with a pin of the lookup table having the shortest propagation delay.

* * * * *